United States Patent [19]

Nakano

[11] Patent Number: 5,301,002
[45] Date of Patent: Apr. 5, 1994

[54] APPARATUS FOR INSPECTING A SEMICONDUCTOR DEVICE

[75] Inventor: Akihiko Nakano, Nara, Japan

[73] Assignee: Sharp Kabushiki Kaisha, Osaka, Japan

[21] Appl. No.: 870,872

[22] Filed: Apr. 20, 1992

[30] Foreign Application Priority Data

Apr. 22, 1991 [JP] Japan .................................. 3-119441

[51] Int. Cl.$^5$ ............................................ H01L 21/66
[52] U.S. Cl. .................................................... 356/36
[58] Field of Search ...................... 356/30, 31, 36, 237; 359/372

[56] References Cited

U.S. PATENT DOCUMENTS 4,818,169 4/1989 Schram ................................ 414/331
5,028,780 7/1991 Kaito et al. ........................... 250/307

FOREIGN PATENT DOCUMENTS

WO91/04634 4/1991 PCT Int'l Appl. .

OTHER PUBLICATIONS

IBM Technical Disclosure Bulletin, vol. 31, No. 10, Mar. 1989 pp. 474-479.
Japanese Abstracts of Japan No. JP 1254845, Publication Date Nov. 10, 1989 Hidehiko et al, Method and Device for Inspecting Semiconductor Element.
Japanese Abstracts of Japan No. 62-87838, Publication date Apr. 1987 Ueda, Specimen Preparing Jig for Observing Cross-Section of IC Chip.

Primary Examiner—Richard A. Rosenberger
Attorney, Agent, or Firm—Nixon & Vanderhye

[57] ABSTRACT

An inspecting apparatus is provided by which a cross section of a semiconductor device to be inspected can be easily obtained. The inspection apparatus includes a first microscope for specifying a portion where the inspection of a cross section is to be effected, a rotary grinder for grinding the portion specified by the first microscope, a second microscope for monitoring the portion ground by the rotary grinder, and a stage for fixing the semiconductor device movable relative to the first and second microscopes and the rotary grinder.

18 Claims, 3 Drawing Sheets

APPARATUS FOR INSPECTING A SEMICONDUCTOR DEVICE

BACKGROUND OF THE INVENTION

1. Field of the Invention

The present invention relates to a semiconductor device inspecting apparatus for inspecting a cross section of a semiconductor device.

2. Description of the Background Art

In the following description, "semiconductor device" refers to a wafer before dicing on which a plurality of chip patterns are formed, or to a chip after dicing.

An inspection checking a cross section of a semiconductor device is effected for confirming whether or not the process steps for manufacturing the semiconductor device is proper, or to analyze the cause of malfunction of a semiconductor device. A sample for such inspection is prepared by cleavage or grinding. In the former method, a portion corresponding to a cross section to be checked is scratched by means of a diamond pen or the like, and the semiconductor device is cleaved from the crack. In the latter method, a semiconductor device 200 is depressed to a rotary grinding plate by using a jig 310 for grinding, and the cross section to be inspected is exposed.

However, the above mentioned two methods of preparing samples have the following problems. In the former method, it is very difficult to obtain accurately the cross section to be inspected. The accuracy in scratching by a diamond pen is in the order of millimeter, while the accuracy in the order of submicron is required in recent semiconductor devices formed with high density. Further, as the patterns of semiconductor devices are, in most cases, aligned linearly, the number of patterns appearing at the cross section should be as large as possible. However, it is very difficult to obtain a linear cross section by cleavage.

In the latter method, it is necessary to interrupt grinding to carry out microscopic monitoring so as to determine whether or not the cross section to be inspected is obtained. Since grinding with floating abrasive grains is carried out at the final stage for finishing, the abrasive grains may enter or scrape interconnections and the like appearing on the cross section of the semiconductor device, making it difficult to obtain a fine cross section. Although it is possible to obtain a linear cross section by this method, it is difficult to align the direction of grinding with the cross section to be inspected.

In addition, in both methods, aluminum used as interconnections or bonding wires in the semiconductor device extends and adheres on the cross section during cleavage or grinding, and thus it is difficult to obtain an accurate cross section. In addition, both methods require much skill, and an ordinary operator can not do well the task.

SUMMARY OF THE INVENTION

An object of the present invention is to provide an apparatus for inspecting a semiconductor device by which a cross section to be inspected can be linearly obtained easily.

Another object of the present invention is to provide an apparatus for inspecting a semiconductor device by which an ordinary operator without match skill can easily obtaine a cross section to be inspected.

A still further object of the present invention is to provide an apparatus for inspecting a semiconductor device enabling immediate inspection, by which the cross section to be inspected can be easily obtained.

The apparatus for inspecting the semiconductor device in accordance with the present invention includes a first microscope, a rotary grinder, a second microscope and a stage. The first microscope specifies a portion including a cross section to be inspected of the semiconductor device. The rotary grinder grinds the specified portion in order to expose the cross section to be inspected. The second microscope monitors the exposed cross section. The stage is arranged movable relative to the first and second microscopes and the rotary grinder, and fixes the semiconductor device.

By the present invention, the cross section to be inspected of the semiconductor device can be easily and linearly obtained by any person. In addition, the cross section of the semiconductor device can be inspected immediately. In addition, since the portion to be inspected of the semiconductor device is ground by means of a rotary grinder, that is, without using floating abrasive grains, a fine cross section to be inspected can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
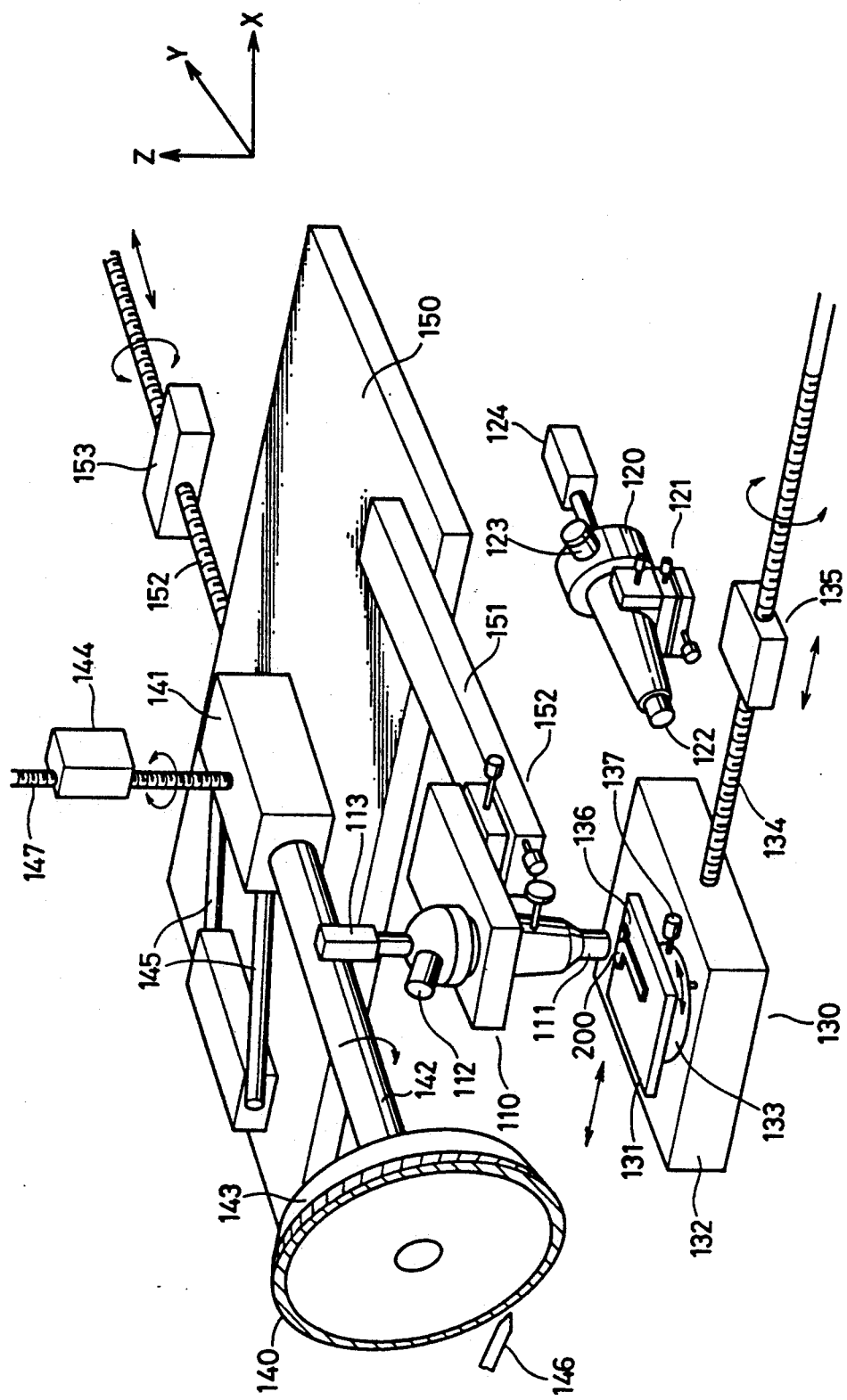
FIG. 1 is a schematic diagram of an apparatus for inspecting a semiconductor device in accordance with one embodiment of the present invention.

One embodiment of the present invention will be described with reference to FIGS. 1 to 3. In the following description, the X direction, Y direction and Z direction are as shown by the arrows in FIG. 1.

An apparatus 100 for inspecting a semiconductor device in accordance with the present invention includes a first microscope 110 for specifying a portion of a semiconductor device 200 at which cross section is to be inspected, a rotary grinder 140 for grinding the portion specified by the first microscope 110, a second microscope 120 for inspecting the portion ground by the rotary grinder 140, and a stage 130 for fixing the semiconductor device movable relative to the first and second microscopes 110 and 120 and the rotary grinder 140.

The stage 130 for fixing the semiconductor device includes a fixing portion 131 for fixing semiconductor device 200, a base plate 132 through which a screw 134 passes through, and a rotary table 133 provided on the base plate 132 for rotating, in $\theta$ direction, the fixing portion 131. The screw 134 is rotated by a pulse motor 135 and moves the stage 130 for fixing the semiconductor device in the direction of the X axis. In the figure, the reference numeral 136 denotes a clip for fixing the semiconductor device 200 with respect to the fixing portion 131. The reference numeral 137 denotes a screw for fine adjustment of the rotary table 133.

The first microscope 110 is to monitor the surface of the semiconductor device 200 fixed on the stage 130 for fixing the semiconductor device, and is attached at an end portion of an arm 151 provided on stage 150. The first microscope 110 includes an objective lens 111 of 100 magnifications, and an ocular of 10 to 20 magnifications. The enlarged image can be monitored by a display, not shown, through a video camera 113. A unit for slight movement 152 for slightly moving the first microscope 110 in the directions of X and Y axis are provided between the arm 151 and first microscope 110.

Figure 2:
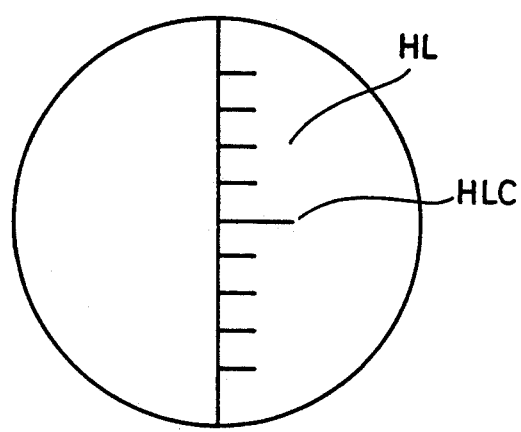
FIG. 2 is an illustration of a field of view of the first microscope.
Figure 3:
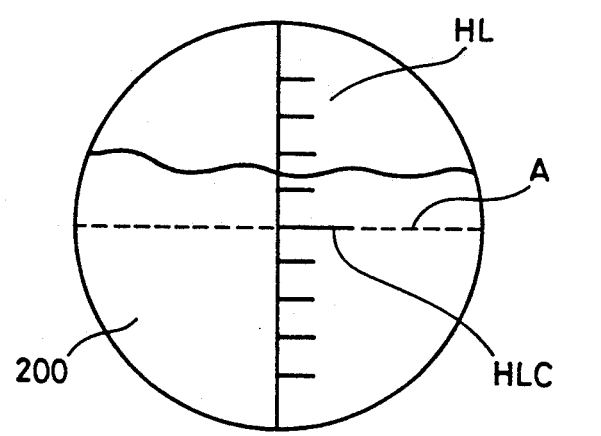
FIG. 3 is an illustration showing a field of view of the first microscope during grinding.
Figure 4:
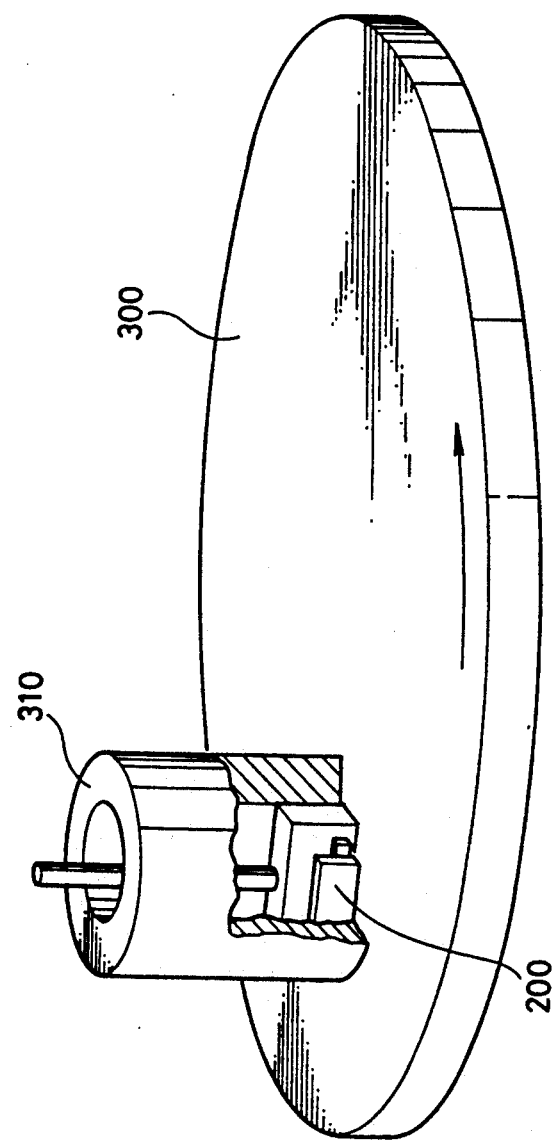
FIG. 4 shows a conventional method of grinding a semiconductor device.

A hair line HL is provided as shown in FIG. 2 in the first microscope 110. A portion of the hair line HL indicating the center of the field of view, that is, the central hair line HL is made longer than others. The center HCL of the hair line HL is set to be aligned with the portion to be ground by the rotary grinder 140. Therefore, if the stage 130 fixing the semiconductor device is moved to the side of the rotary grinder 140 with the expected cross section A (shown by the dotted line in FIG. 3), that is, the cross section to be inspected of the semiconductor device 200 aligned with the center HCL, the expected cross section A is ground, and the cross section to be inspected is exposed.

The rotary grinder 140 is for grinding the semiconductor device 200, and detachably attached at a flange portion 143 and an end of a driving axis 142 of a motor 141 provided on the stage 150. A screw 147 is provided at a casing of the motor 141, which is movable up and down, that is, movable in the Z direction by means of a pulse motor 144. A pair of guide arms 145 is provided at the casing, ensuring the upward and downward movement. The grain size of the abrasive grains of the rotary grinder 140 depends on the semiconductor device 200 to be ground, and generally, #8000 or #10000 is used.

The stage 150 provided with the first microscope 110 and the rotary grinder 140 is movable in the Y direction by a screw 152 and a pulse motor 153.

The second microscope 120 is provided at a position where the objective lens 122 is aligned with the cross section of the semiconductor device 200 so that the semiconductor device 200 can be monitored in the direction of the Y axis, that is, the direction orthogonally crossing the first microscope 110, so as to monitor the cross section of the semiconductor device 200. The second microscope 120 is attached on the unit for slight movement 121 which can slightly move the second microscope 120 in the X, Y and Z directions. The objective lens 122 is adapted to have 100 magnifications, and the ocular 123 has 10 to 20 magnifications, and the field of view can be seen on a display, not shown, through a TV camera 124.

The inspection of the semiconductor device 200 by the apparatus for inspecting the semiconductor device having the above structure will be described.

In order to reduce the amount of grinding as much as possible, the semiconductor device 200 is cleaved at a portion as near as possible to the cross section to be inspected, that is, the expected cross section A.

A semiconductor device 200 to be inspected is fixed on a fixing portion 131 of the stage 130 for fixing the semiconductor device. At this time, the semiconductor device 200 is fixed such that the expected cross section A is within at least the field of view of the first microscope 110. The fixed semiconductor device 200 is monitored by the first microscope 110, and the rotary table 133 and the unit for slight movement 152 are adjusted so that the expected cross section A is aligned with the center HCL of the hair line HL.

When the expected cross section A is aligned with the center of the hair line HCL, the stage 130 for fixing the semiconductor device is moved in the X direction so that the semiconductor device 200 is ground by the rotary grinder 140. The speed of feeding of the stage 130 during grinding is preferably set at about 0.2 mm/sec., and the speed of rotation of the rotary grinder 140 is preferably set to 10000 rpm to 30000 rpm. The grinding is effected with a cooled water for washing injected from an injection nozzle 146 provided near the rotary grinder 140.

When a cross section to be inspected is obtained by grinding, the stage 130 fixing the semiconductor device is moved in the direction of the second microscope 120. Since the objective lens 122 of the second microscope 120 is provided to be aligned with the cross section of the semiconductor device 200, the cross section of the semiconductor device 200 can be inspected only by moving the stage 130 fixing the semiconductor device to a prescribed position. The cross section is displayed on a display, not shown, through a TV camera 124. The semiconductor device 200 may be taken out from the stage 130 fixing the semiconductor device, and it may be inspected by other inspection equipment such as an electron microscope, if necessary.

Although the expected cross section A is obtained by only one step of grinding in the above described embodiment, a plurality of steps of grinding may be necessary, as the amount of grinding at one time is set to be several microns or less. In such a case, the semiconductor device 200 is moved in the Y direction by means of the unit for slight movement 152 by several microns at the end of every grinding, and grinding is repeated for a plurality of times until the expected cross section is obtained.

Although the semiconductor device 200 was subjected to cleavage in advance so as to reduce the amount of grinding, a rotary grinder 140 for cutting and not for grinding may be provided on the apparatus 100 for inspecting the semiconductor device, so as to cut the device in the similar manner as grinding by the rotary grinder 140, and then grinding may be done with the rotary grinder 140 exchanged.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An apparatus for inspecting a semiconductor device, comprising:
   a first microscope for monitoring a main surface of a semiconductor device along a first direction and specifying a portion of the semiconductor device to be inspected;
   a rotary grinder for grinding the specified portion to expose a cross section of the semiconductor device that is substantially perpendicular to the main surface;
   a second microscope for monitoring the exposed cross section along a second direction substantially perpendicular to the first direction; and a stage, movable relative to the first and second microscopes and the rotary grinder, for fixing the semiconductor device.

2. The apparatus for inspecting a semiconductor device according to claim 1, wherein
said stage includes a fixing portion for fixing said semiconductor device, a rotary table for rotating said fixing portion, and a base plate on which said fixing portion and said rotary table are provided.

3. An apparatus for inspecting a semiconductor device according to claim 2, further comprising
means for moving said stage relative to said first and second microscopes and said rotary grinder.

4. An apparatus for inspecting a semiconductor device according to claim 1, further comprising
a table on which said first microscope and said rotary grinder are provided.

5. An apparatus for inspecting a semiconductor device according to claim 4, wherein
said first microscope and said rotary grinder are arranged on said table such that the center of a field of view of said first microscope is aligned with a grinding surface of said rotary grinder.

6. An apparatus for inspecting a semiconductor device according to claim 5, further comprising
means for moving said table relative to said stage.

7. An apparatus for inspecting a semiconductor device according to claim 1, further comprising:
an injection nozzle located near the rotary grinder for injecting fluid onto the grinder.

8. An apparatus for inspecting a semiconductor device according to claim 1, wherein the semiconductor device is cleaved near the cross section before grinding.

9. An apparatus for inspecting a semiconductor device according to claim 1, wherein the cross section is in the field of view of the first microscope, the first microscope having a hair line indicating the center of the field of view to be aligned with the cross section.

10. An apparatus for inspecting a semiconductor device according to claim 1, wherein the second microscope includes an objective lens and an ocular.

11. An apparatus for inspecting a semiconductor device, comprising:
a first optical microscope having an ocular and magnifying objective lens for optically specifying and monitoring a surface portion of a semiconductor device,
a rotary grinder for grinding the specified portion to expose a cross section of the semiconductor device;
a second optical microscope having an ocular and magnifying objective lens for optically monitoring the exposed cross section; and
a stage, movable relative to the first and second microscopes and the rotary grinder, for fixing the semiconductor device.

12. An apparatus for inspecting a semiconductor device according to claim 11, wherein the first microscope includes a hair line for indicating the specified portion.

13. The apparatus for inspecting a semiconductor device according to claim 11, wherein
the stage includes a fixing portion for fixing the semiconductor device, a rotary table for rotating the fixing portion, and a base plate on which the fixing portion and rotary table are provided.

14. An apparatus for inspecting a semiconductor device according to claim 11, further comprising:
means for moving the stage relative to the first and second microscopes and the rotary grinder.

15. An apparatus for inspecting a semiconductor device according to claim 11, further comprising:
a table on which the first microscope and the rotary grinder are provided.

16. An apparatus for inspecting a semiconductor device according to claim 11, wherein the first microscope and the rotary grinder are arranged on the table such that the center of a field of view of the first microscope is aligned with a grinding surface of the rotary grinder.

17. An apparatus for inspecting a semiconductor device according to claim 11, wherein the portion monitored by the first microscope is perpendicular to the cross section to be inspected.

18. An apparatus for inspecting a semiconductor device according to claim 11, further comprising:
means for cleaving the semiconductor near the specified portion and thereafter grinding the cross section from the cleaved portion.

* * * * *